(12) United States Patent
Miyoshi et al.

(10) Patent No.: US 8,310,054 B2
(45) Date of Patent: Nov. 13, 2012

(54) SEMICONDUCTOR DEVICE MANUFACTURING METHOD AND TARGET SUBSTRATE PROCESSING SYSTEM

(75) Inventors: Hidenori Miyoshi, Nirasaki (JP); Kazuichi Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/178,291

(22) Filed: Jul. 7, 2011

(65) Prior Publication Data

US 2011/0265950 A1   Nov. 3, 2011

Related U.S. Application Data

(62) Division of application No. 12/173,350, filed on Jul. 15, 2008, now Pat. No. 8,003,535.

(30) Foreign Application Priority Data

Aug. 9, 2007 (JP) ................................ 2007-207909

(51) Int. Cl.
*H01L 29/40* (2006.01)
(52) U.S. Cl. .......... 257/762; 134/3; 700/121; 156/345.1
(58) Field of Classification Search .................. 257/751, 257/758, 762, E21.585; 134/3; 700/121; 156/345.1, 345.22, 345.31, 345.32
See application file for complete search history.

(56) References Cited

U.S. PATENT DOCUMENTS

2009/0042384 A1   2/2009   Miyoshi et al.
2011/0265950 A1*  11/2011  Miyoshi et al. ............ 156/345.3

FOREIGN PATENT DOCUMENTS

| JP | 2001-271192 | 10/2001 |
| JP | 2005-330546 | 12/2005 |
| JP | 2008-31541 | 2/2008 |

* cited by examiner

*Primary Examiner* — Jack Chen
(74) *Attorney, Agent, or Firm* — Oblon, Spivak, McClelland, Maier & Neustadt, L.L.P.

(57) ABSTRACT

A semiconductor device manufacturing method includes removing copper deposits, by use of an organic acid gas and an oxidizing gas, from a surface of a second interlayer insulation film having a groove formed therein and reaching a copper-containing electric connector member. The second interlayer insulation film is disposed on a first interlayer insulation film provided with the electric connector member. The method then includes reducing a surface of the electric connector member exposed at a bottom of the groove of the second interlayer insulation film; forming a barrier layer on the second interlayer insulation film; and forming a copper-containing conductive film to fill the groove of the second interlayer insulation film.

10 Claims, 12 Drawing Sheets

SEMICONDUCTOR DEVICE MANUFACTURING METHOD AND TARGET SUBSTRATE PROCESSING SYSTEM

CROSS-REFERENCE TO RELATED APPLICATIONS

This application is a division of U.S. Ser. No. 12/173,350 filed Jul. 15, 2008, the entire content of which is incorporated herein by reference, and claims priority under 35 U.S.C. 119 to Japanese Application No. 2007-207909, filed Aug. 9, 2007.

BACKGROUND OF THE INVENTION

1. Field of the Invention

The present invention relates to a semiconductor device manufacturing method, a target substrate processing system, and a storage medium, and particularly to a method for manufacturing semiconductor devices that include a copper-containing conductive film, and a system for processing a target substrate and a storage medium for the same.

2. Description of the Related Art

In recent years, semiconductor devices employ multi-layered structures including interconnection lines stacked one above the other, so as to increase the operation speed and to decrease the size. In order to increase the operation speed, it is necessary to decrease the resistivity of interconnection lines and the electric capacitance between interconnection lines. For this reason, copper (Cu), which is low in resistivity, is widely used for interconnection lines, while a low dielectric constant insulation film (Low-k film) is widely used for interlayer insulation films between Cu interconnection lines to decrease the capacitance between the Cu interconnection lines.

However, in a case where a Cu interconnection line is formed by use of a damascene method, when etching of an interlayer insulation film and ashing of a photo-resist are performed, the surface layer of the Cu interconnection line exposed at the bottom of an interconnection groove or via-groove is partly etched. The Cu particles thus generated by etching are generally deposited on the side surface of the interlayer insulation film inside the groove or the upper surface of the interlayer insulation film. If a heat process or electric field is applied to the structure with Cu deposits present thereon, Cu may be diffused into the interlayer insulation film. Cu thus diffused into the interlayer insulation film lowers the yield of semiconductor devices.

In general, wet cleaning is performed to remove Cu deposits present on interlayer insulation films.

However, where an interlayer insulation film is formed of a Low-k film, the Low-k film may absorb moisture in wet cleaning and increase the dielectric constant. Accordingly, it is not preferable to perform wet cleaning in a state where a Low-k film is exposed.

A water vapor process other than wet cleaning has been proposed, (Jpn. Pat. Appln. KOKAI Publications No. 2001-271192), but this process may also increase the dielectric constant of Low-k films due to the presence of water ($H_2O$).

A method for removing Cu deposits by organic acid dry cleaning is known (Jpn. Pat. Appln. KOKAI Publications No. 2005-330546), but dry cleaning that merely uses an organic acid gas cannot provide the effect of removing Cu deposits comparable to wet cleaning, unless the Cu deposits have been oxidized.

Further, a method for removing copper deposits while supplying acetic acid vapor and water vapor or supplying oxygen is known (Jpn. Pat. Appln. KOKAI Publications No. 2001-271192), but the water vapor may increase the dielectric constant of Low-k films, as described, and oxygen may increase the interconnection line resistance due to oxidation of underlying Cu layers.

BRIEF SUMMARY OF THE INVENTION

An object of the present invention is to provide a semiconductor device manufacturing method, which can remove copper deposits without entailing an increase in the resistivity of an underlying metal film or an increase in the dielectric constant of a low dielectric constant insulation film due to moisture absorption. Another object of the present invention is to provide a target substrate processing system used for this manufacturing method and a storage medium used for controlling the processing system.

According to a first aspect of the present invention, there is provided a semiconductor device manufacturing method comprising: removing copper deposits, by use of an organic acid gas and an oxidizing gas, from a surface of a second interlayer insulation film having a groove formed therein and reaching a copper-containing electric connector member, the second interlayer insulation film being disposed on a first interlayer insulation film provided with the electric connector member; reducing a surface of the electric connector member exposed at a bottom of the groove of the second interlayer insulation film; forming a barrier layer on the second interlayer insulation film; and forming a copper-containing conductive film to fill the groove of the second interlayer insulation film.

In the first aspect, before said removing copper deposits, the method may further comprise: forming a mask film on the second interlayer insulation film disposed on the first interlayer insulation film, and etching the second interlayer insulation film by use of the mask film as an etching mask, thereby forming the groove of the second interlayer insulation film; and removing the mask film.

The organic acid gas may be a carboxylic acid selected from the group consisting of carboxylic acids expressed by formula (1): $R^1$—COOH . . . (1) (where $R^1$ is hydrogen, or an alkyl group or alkenyl group of a straight chain or branched chain with $C_1$ to $C_{20}$). The oxidizing gas may be selected from the group consisting of $O_2$, $O_3$, $N_2O$, HF, HCl, HBr, HI, $F_2$, $Cl_2$, $Br_2$, and $I_2$. Said reducing a surface of the electric connector member may be performed by a method selected from the group consisting of a hydrogen annealing method, an ultra-low oxygen partial pressure annealing method, and a carbon monoxide annealing method.

According to a second aspect of the present invention, there is provided a target substrate processing system for processing a target substrate that includes a first interlayer insulation film provided with a copper-containing electric connector member and a second interlayer insulation film disposed on the first interlayer insulation film and having a groove formed therein and reaching the electric connector member, the system comprising: a removing implement configured to remove copper deposits from the target substrate by use of an organic acid gas and an oxidizing gas, a reducing implement configured to reduce the electric connector member; a barrier layer forming implement configured to form a barrier layer on the target substrate; and a conductive film forming implement configured to form a copper-containing conductive film on the target substrate.

In the second aspect, the system may comprise a chamber or chambers provided with the removing implement, the reducing implement, the barrier layer forming implement, and the conductive film forming implement. Alternatively, the system may comprise a plurality of chambers respectively provided with the removing implement, the reducing implement, the barrier layer forming implement, and the conductive film forming implement, and a transfer mechanism configured to transfer the target substrate among the chambers.

The removing implement may comprise: an oxidizing implement configured to oxidize the copper deposits by use of the oxidizing gas; and an etching implement configured to etch the oxidized copper deposits by use of the organic acid gas. In this case, the system may comprise a plurality of chambers respectively provided with the oxidizing implement, the etching implement, the reducing implement, the barrier layer forming implement, and the conductive film forming implement, and a transfer mechanism configured to transfer the target substrate among the chambers.

According to a third aspect of the present invention, there is provided a target substrate processing system for processing a target substrate that includes a first interlayer insulation film provided with a copper-containing electric connector member and a second interlayer insulation film disposed on the first interlayer insulation film, along with a mask film disposed on the second interlayer insulation film, the system comprising: a main etching implement configured to etch the second interlayer insulation film by use of the mask film as an etching mask, thereby forming therein a groove reaching the electric connector member; a first removing implement configured to remove the mask film; a second removing implement configured to remove copper deposits from the target substrate by use of an organic acid gas and an oxidizing gas, a reducing implement configured to reduce the electric connector member; a barrier layer forming implement configured to form a barrier layer on the target substrate; and a conductive film forming implement configured to form a copper-containing conductive film on the target substrate.

In the third aspect, the system may comprise a chamber or chambers provided with the main etching implement, the first removing implement, the second removing implement, the reducing implement, the barrier layer forming implement, and the conductive film forming implement. Alternatively, the system may comprise a plurality of chambers respectively provided with the main etching implement, the first removing implement, the second removing implement, the reducing implement, the barrier layer forming implement, and the conductive film forming implement, and a transfer mechanism configured to transfer the target substrate among the chambers.

The second removing implement may comprise: an oxidizing implement configured to oxidize the copper deposits by use of the oxidizing gas; and a sub-etching implement configured to etch the oxidized copper deposits by use of the organic acid gas. In this case, the system may comprise a plurality of chambers respectively provided with the main etching implement, the first removing implement, the oxidizing implement, the sub-etching implement, the reducing implement, the barrier layer forming implement, and the conductive film forming implement, and a transfer mechanism configured to transfer the target substrate among the chambers.

According to a fourth aspect of the present invention, there is provided a storage medium that stores a program for execution on a computer for controlling a target substrate processing system, wherein the program, when executed, causes the computer to control the target substrate processing system to conduct a semiconductor device manufacturing method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
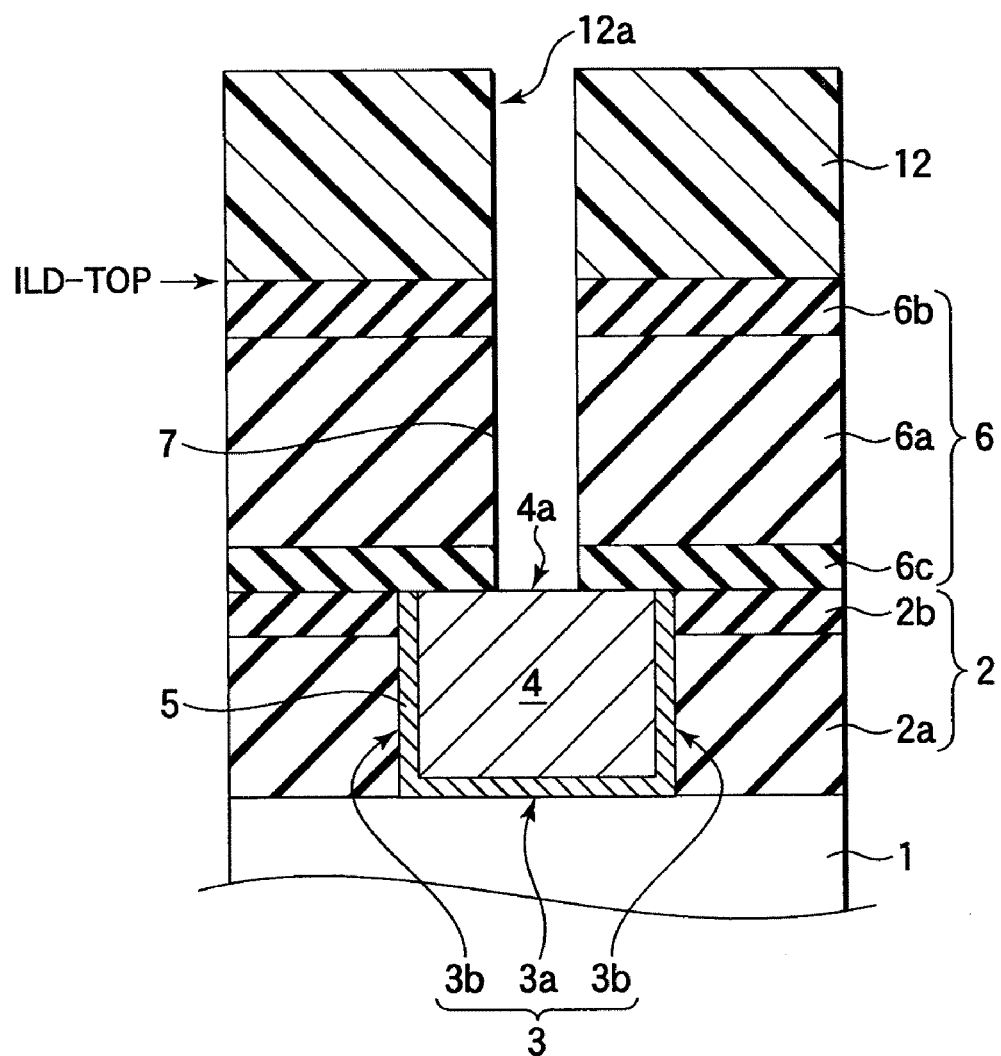
FIG. 1 is a sectional view showing a main process step of a semiconductor device manufacturing method according to an embodiment of the present invention.

Embodiments of the present invention will now be described with reference to the accompanying drawings. In all the drawings, the constituent elements having substantially the same function and arrangement are denoted by the same reference numerals.

FIGS. 1 to 7 are sectional views showing main process steps of a semiconductor device manufacturing method according to an embodiment of the present invention.

FIG. 1 shows a cross-section of a semiconductor device in the process of manufacturing.

As shown in FIG. 1, a first interlayer insulation film 2 is formed on a semiconductor substrate 1 including interlayer insulation films and so forth. The first interlayer insulation film 2 has a groove 3 formed therein, such as an interconnection groove or a connecting hole for connecting an upper interconnection line and a lower interconnection line, and an interconnection line 4 is formed in the groove 3. This interconnection line 4 is formed from a conductive film made of copper (Cu) and laminated on a barrier layer 5. Accordingly, in this embodiment, the interconnection line 4 is a copper interconnection line (which will be referred to as a copper interconnection line 4), as an example. The barrier layer 5 covers the bottom 3a and side surface 3b of the groove and surrounds the copper interconnection line 4. The barrier layer 5 serves to prevent copper diffusion.

In this embodiment, the first interlayer insulation film 2 comprises a low dielectric constant insulation film 2a having a dielectric constant lower than those of inorganic silicon oxide films. Further, a hard mask layer 2b made of a material different from the low dielectric constant insulation film 2a is formed on the upper surface of the low dielectric constant insulation film 2a.

On top of the first interlayer insulation film 2, a second interlayer insulation film 6 is formed. In this embodiment, the second interlayer insulation film 6 comprises a low dielectric constant insulation film 6a having a dielectric constant lower than those of inorganic silicon oxide films, as in the first interlayer insulation film 2. A hard mask layer 6b made of a material different from the low dielectric constant insulation film 6a is formed on the upper surface of the low dielectric constant insulation film 6a. Further, an etching stopper layer 6c made of a material different from the low dielectric constant insulation film 6a is formed on the lower surface of the low dielectric constant insulation film 6a.

On the upper surface (ILD-TOP) of the second interlayer insulation film, a photo-resist film 12 is formed. The photo-resist film 12 has an opening 12a formed therein in accordance with a groove pattern, such as an interconnection groove or interconnection line connecting hole, in which an internal electric connector member of the semiconductor device is embedded.

The cross-section shown in FIG. 1 is a state obtained when anisotropic etching, such as RIE (Reactive Ion Etching), is performed by use of the photo-resist film 12 as a mask to etch the hard mask layer 6b, low dielectric constant insulation film 6a, and etching stopper layer 6c, and a groove 7 for embedding an internal electric connector member is thereby formed in the second interlayer insulation film 6.

In this embodiment, after the photo-resist film 12 is removed from the semiconductor substrate having the structure described above, a barrier layer is formed on the semiconductor substrate, and then an internal electric connector member, such as a conductive film for forming an interconnection line or via-member, is formed to fill the groove 7.

In the state shown in FIG. 1, since the second interlayer insulation film has been etched, the upper surface 4a of the copper interconnection line 4 is exposed at the bottom of the groove 7. At this time, an etchant, e.g., ions in this embodiment, collides with the surface of the copper interconnection line 4, and copper is thus sputtered out of the copper interconnection line 4 and scattered outward from the semiconductor substrate.

Figure 2:
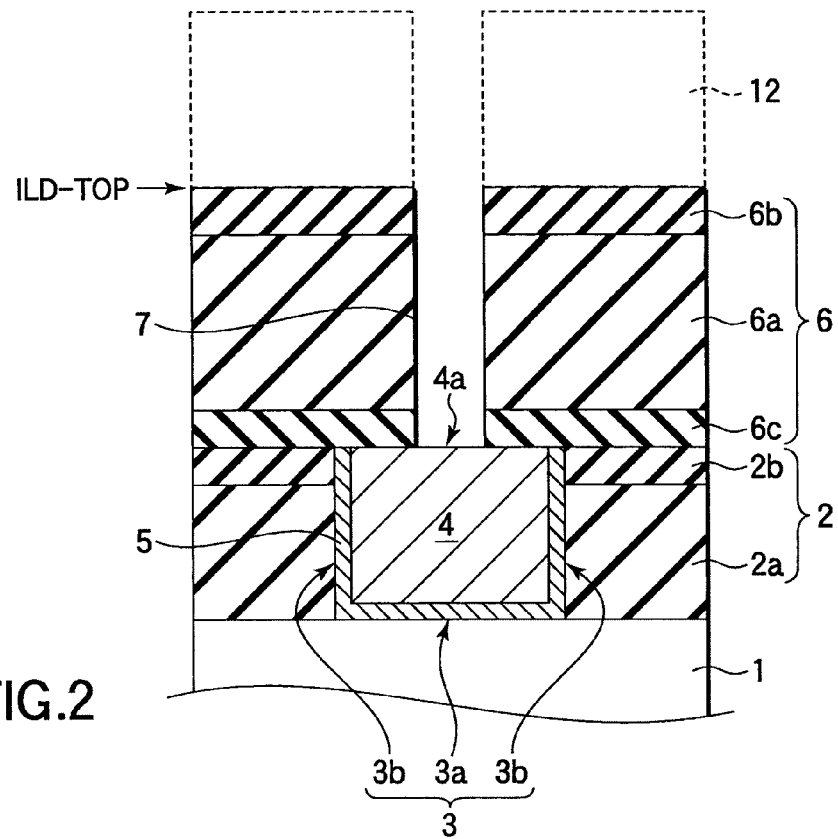
FIG. 2 is a sectional view showing a main process step of the semiconductor device manufacturing method according to an embodiment of the present invention.
Figure 3:
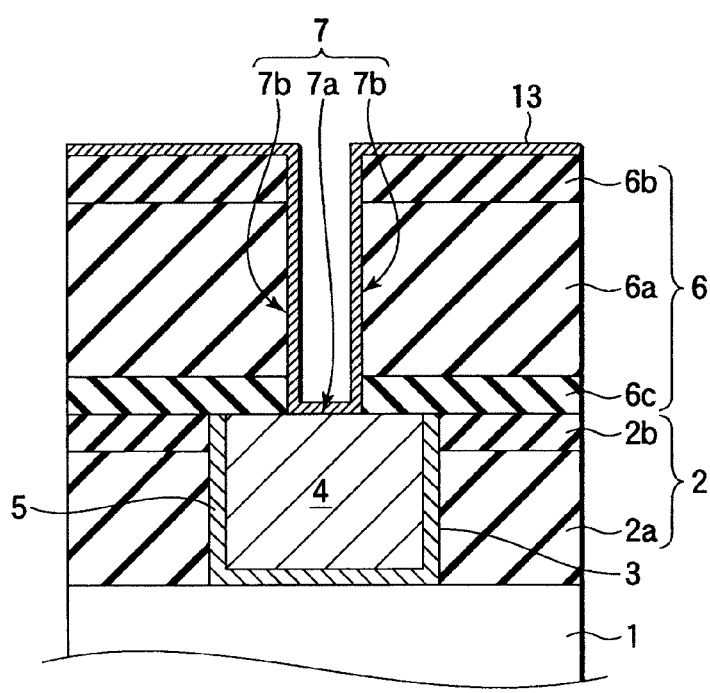
FIG. 3 is a sectional view showing a main process step of the semiconductor device manufacturing method according to an embodiment of the present invention.

Then, as shown in FIG. 2, the photo-resist film 12 is removed by ashing. Also in this ashing, copper is scattered from the upper surface 4a of the copper interconnection line 4. Consequently, as shown in FIG. 3, copper deposits 13 are undesirably deposited on the upper surface (ILD-TOP) of the second interlayer insulation film 6 and the bottom 7a and side surface 7b of the groove 7.

Figure 4:
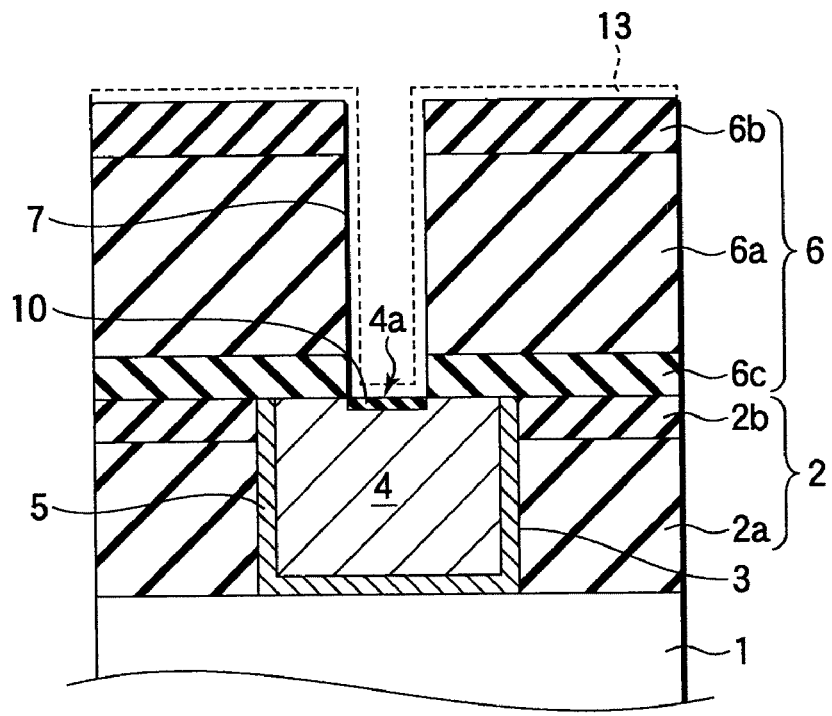
FIG. 4 is a sectional view showing a main process step of the semiconductor device manufacturing method according to an embodiment of the present invention.

In light of this, as shown in FIG. 4, a process is performed to remove the copper deposits 13. In this embodiment, the copper deposits 13 are removed by dry etching without using water. This dry etching is arranged to use an organic acid gas and an oxidizing gas. This etching is arranged to make progress, while the copper deposits 13 are oxidized by the oxidizing gas and turned into a copper oxide ($Cu_2O$ or $CuO$), and then the copper oxide is etched by the organic acid gas. The copper deposits 13 may be oxidized by a halogen (F, Cl, Br, or I), so that the copper deposits 13 are turned into $CuX$ or $CuX_2$, where X is a halogen. In this specification, the oxidation encompasses not only a reaction of copper to be oxidized by oxygen but also a reaction of copper to be halogenated by a halogen.

The organic acid gas may be exemplified by a carboxylic acid including a carboxyl group (—COOH).

The carboxylic acid may be exemplified by a carboxylic acid expressed by the following general formula (1),

(where $R^1$ is hydrogen, or an alkyl group or alkenyl group of a straight chain or branched chain with $C_1$ to $C_{20}$, and preferably methyl, ethyl, propyl, butyl, pentyl, or hexyl).

For example, this type includes:
formic acid (HCOOH),
acetic acid ($CH_3COOH$),
propionic acid ($CH_3CH_2COOH$),
butyric acid ($CH_3(CH_2)_2COOH$), and
valeric acid ($CH_3(CH_2)_3COOH$).

In the first embodiment, the organic acid gas is formic acid.

In place of the organic acid gas, an organic compound gas may be used.

The organic compound may be exemplified by an alcohol, an aldehyde, a carboxylic anhydride, an ester, and a ketone, as well as a carboxylic acid described above.

Where the organic compound is an alcohol, this alcohol may be selected from the group consisting of a primary alcohol, a secondary alcohol, a polyhydroxy alcohol, a cyclic alcohol including a plurality of carbon atoms as a part of the ring, and an aromatic alcohol.

Where the organic compound is an aldehyde, this aldehyde may be selected from the group consisting of:
an aldehyde expressed by the following formula (2),

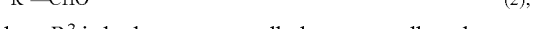

(where $R^2$ is hydrogen, or an alkyl group or alkenyl group of a straight chain or branched chain with $C_1$ to $C_{20}$);
an alkanediol compound expressed by the following formula (3),

(where $R^3$ is a saturated or unsaturated hydrocarbon of a straight chain or branched chain with $C_1$ to $C_{20}$); and
a substance prepared such that $R^3$ is excluded and the two aldehyde groups are bonded to each other in an alkanediol compound expressed by the formula (3).

The carboxylic anhydride may be a substance expressed by the following general formula (4),

(where each of $R^4$ and $R^5$ is hydrogen atom or a hydrocarbon group, or a functional group in which hydrogen atoms forming a hydrocarbon group are at least partly replaced with halogen atoms).

The hydrocarbon group may be exemplified by an alkyl group, an alkenyl group, an alkynyl group, and an allyl group. The halogen atom may be exemplified by fluorine, chlorine, bromine, and iodine.

The carboxylic anhydride may be exemplified by formic anhydride, propionic anhydride, acetic/formic anhydride, butyric anhydride, and valeric anhydride, as well as acetic anhydride described above.

The ester may be a substance expressed by the following general formula (5), $$R^6\text{—COO—}R^7 \tag{5}$$

(where $R^6$ is hydrogen atom or a hydrocarbon group, or a functional group in which hydrogen atoms forming a hydrocarbon group are at least partly replaced with halogen atoms, and $R^7$ is a hydrocarbon group or a functional group in which hydrogen atoms forming a hydrocarbon group are at least partly replaced with halogen atoms).

The hydrocarbon group and halogen atom may be exemplified by the same substances as those described above.

The ester may be exemplified by methyl formate, ethyl formate, propyl formate, butyl formate, benzyl formate, methyl acetate, ethyl acetate, propyl acetate, butyl acetate, pentyl acetate, hexyl acetate, octyl acetate, phenyl acetate, benzyl acetate, allyl acetate, propenyl acetate, methyl propionate, ethyl propionate, butyl propionate, pentyl propionate, benzyl propionate, methyl butyrate, ethyl butyrate, pentyl butyrate, butyl butyrate, methyl valerate, and ethyl valerate.

The oxidizing gas may be exemplified by oxygen ($O_2$), ozone ($O_3$), nitrogen oxide ($N_2O$), air, hydrogen fluoride (HF), hydrogen chloride (HCl), hydrogen bromide (HBr), hydrogen iodide (HI), fluorine ($F_2$), chlorine ($Cl_2$), bromine ($Br_2$), and iodine ($I_2$).

Of these oxidizing gases, oxygen is preferably used in light of handling and quality. In the first embodiment, the oxidizing gas is oxygen.

Where the oxidizing gas is oxygen and the organic acid gas is formic acid, the copper deposits 13 are etched in accordance with the following reaction formulas (6) and (7), $$4Cu + O_2 \rightarrow 2Cu_2O \tag{6}$$

$$2Cu_2O + 2HCOOH \rightarrow 2Cu(HCOO) + H_2O \tag{7}$$

wherein Cu(HCOO) is volatile.

$H_2O$ generated by the reaction expressed by the formula (7) may be absorbed as moisture in a Low-k film. However, since the quantity of the copper deposits 13 is small, the amount of $H_2O$ generated in the formula (7) is also small and thus can hardly change the dielectric constant of the Low-k film.

The organic acid gas and oxidizing gas may be supplied in accordance with the following method.

Figure 8A:
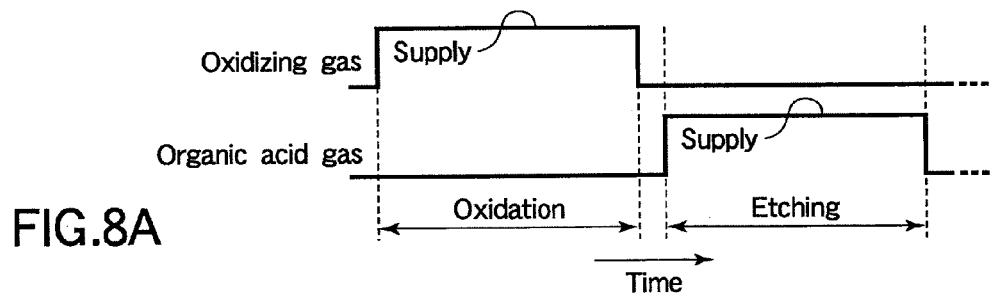
FIGS. 8A, 8B, and 8C are views showing manners of supplying an organic acid gas and an oxidizing gas.

1) The oxidizing gas is first supplied to oxidize copper, and the organic acid gas is then supplied to etch the copper oxide (FIG. 8A).

The process conditions used for this method may be set as follows:

In-chamber pressure: 1 Pa or more and 101.3 kPa or less,
Substrate temperature: 100° C. or more and 400° C. or less,
In-chamber atmosphere (for oxidation): $O_2$ at 100% or $O_2$ diluted with an inactive gas,
Oxidation time: 1 sec or more and 600 sec or less,
In-chamber atmosphere (for etching): formic acid at 100% or formic acid diluted with an inactive gas, and
Etching time: 1 sec or more and 600 sec or less.

Figure 8B:
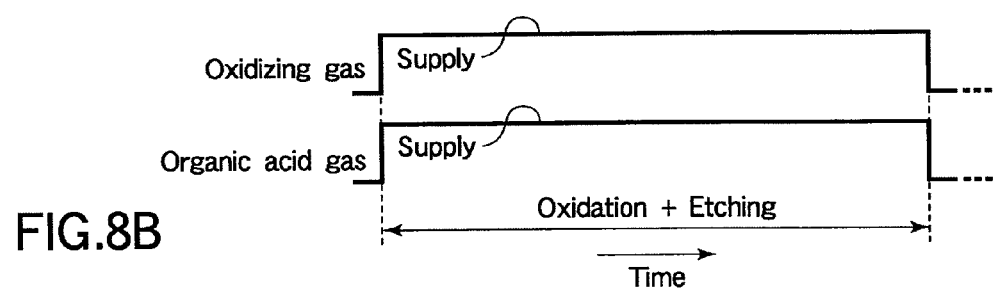

2) The oxidizing gas and organic acid gas are supplied at the same time to essentially simultaneously perform oxidation of copper and etching of the copper oxide (FIG. 8B).

The process conditions used for this method may be set as follows:

In-chamber pressure: 1 Pa or more and 101.3 kPa or less,
Substrate temperature: 100° C. or more and 400° C. or less,
In-chamber atmosphere: $O_2$ and formic acid (which may be diluted with an inactive gas), and
Process time: 1 sec or more and 600 sec or less.

Figure 8C:
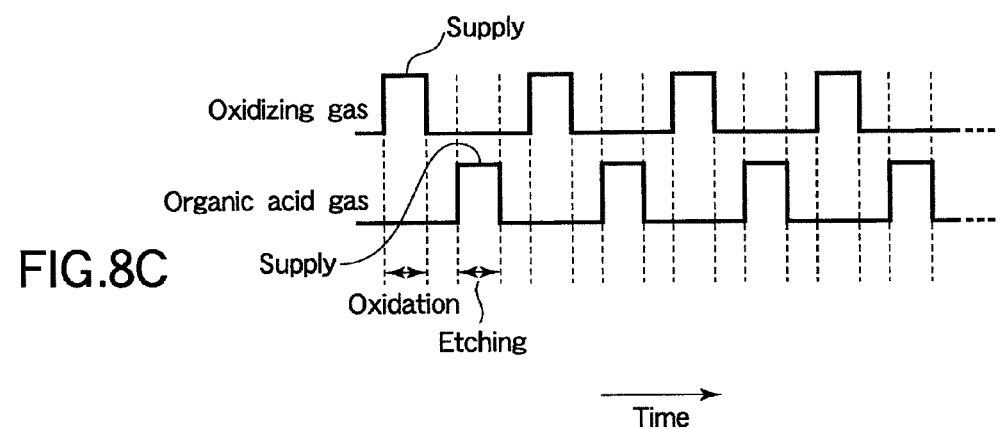

3) The oxidizing gas and organic acid gas are alternately supplied to alternately repeat oxidation of copper and etching of the copper oxide (FIG. 8C).

The process conditions used for this method may be set as follows:

In-chamber pressure: 1 Pa or more and 101.3 kPa or less,
Substrate temperature: 100° C. or more and 400° C. or less,
In-chamber atmosphere (for oxidation): $O_2$ at 100% or $O_2$ diluted with an inactive gas,
Oxidation time: 0.1 sec or more and 30 sec or less,
In-chamber atmosphere (for etching): formic acid at 100% or formic acid diluted with an inactive gas,
Etching time: 0.1 sec or more and 30 sec or less, and
Number of repetitions: 2 or more and 100 or less.

In this embodiment, since an oxidizing gas is used for removing the copper deposits 13, the copper interconnection line 4 may be oxidized internally from the surface, and copper oxide 10 may thereby be generated on the upper surface 4a of the copper interconnection line 4.

Figure 5:
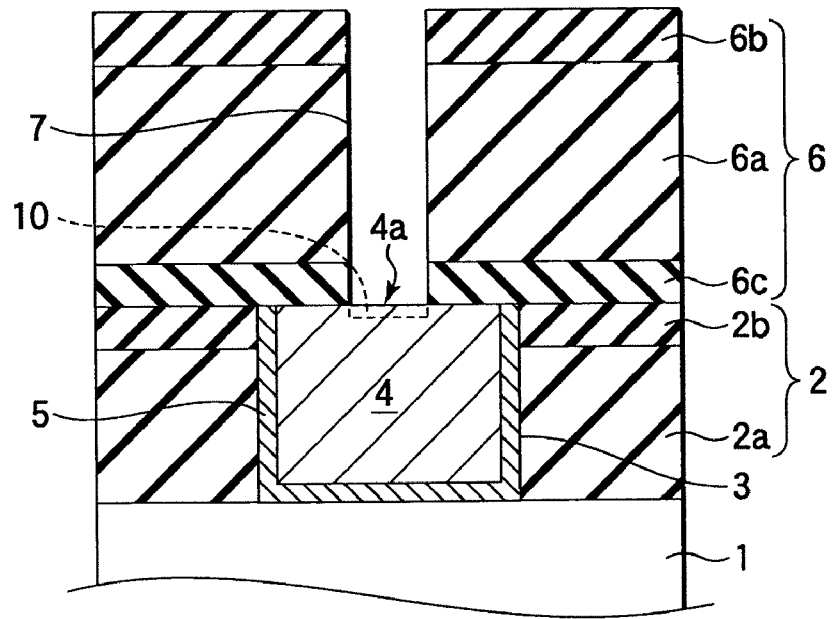
FIG. 5 is a sectional view showing a main process step of the semiconductor device manufacturing method according to an embodiment of the present invention.

In light of this, as shown in FIG. 5, this embodiment is arranged to perform a process for reducing the copper oxide 10 generated on the upper surface 4a of the copper interconnection line 4 to return it to copper. In this embodiment, no organic acid gas is used for the reduction to prevent a copper film present in the groove, i.e., the copper interconnection line 4 in this embodiment, from being etched. Alternatively, the reduction is performed by use of a well-known hydrogen annealing method, well-known ultra-low oxygen partial pressure annealing method, or well-known carbon monoxide annealing method. By use of such a well-known hydrogen annealing method, well-known ultra-low oxygen partial pressure annealing method, or well-known carbon monoxide annealing method, it is possible to reduce only the copper oxide 10 generated on the upper surface 4a of the copper interconnection line 4 to return it to copper, without etching the copper interconnection line 4 present in the groove 5.

Where the hydrogen annealing method is used, the process conditions may be set as follows:

In-chamber pressure: 1 Pa or more and 101.3 kPa or less,
Substrate temperature: 200° C. or more or 40° C. or less,
In-chamber atmosphere: hydrogen at 100% or hydrogen diluted with an inactive gas, and
Process time: 10 sec or more and 300 sec or less.

Where the ultra-low oxygen partial pressure annealing method is used, the process conditions may be set as follows:

In-chamber pressure: 1 Pa or more and 101.3 kPa or less,
Substrate temperature: 100° C. or more and 400° C. or less,
In-chamber atmosphere: $O_2$ with a partial pressure of $10^{-13}$ atm or less, and
Process time: 1 sec or more and 600 sec or less.

Where the carbon monoxide annealing method is used, the process conditions may be set as follows:

In-chamber pressure: 1 Pa or more and 101.3 kPa or less,
Substrate temperature: 200° C. or more and 400° C. or less,
In-chamber atmosphere: carbon monoxide at 100% or carbon monoxide diluted with an inactive gas, and
Process time: 10 sec or more and 300 sec or less.

Figure 6:
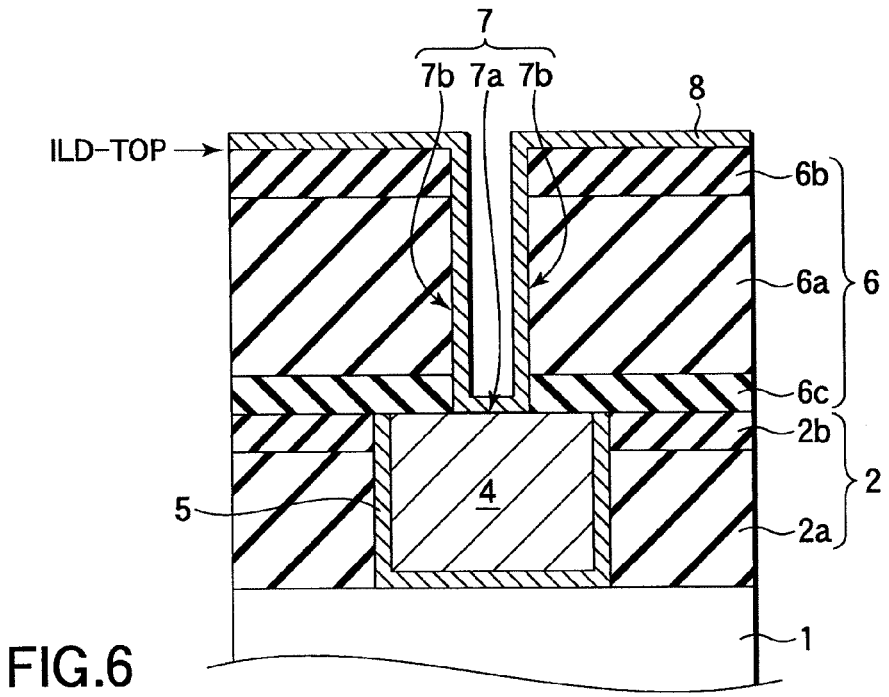
FIG. 6 is a sectional view showing a main process step of the semiconductor device manufacturing method according to an embodiment of the present invention.

Then, as shown in FIG. 6, after the reduction of the copper oxide 10 is performed, and before a copper oxide is regenerated, a barrier is deposited to form a barrier layer 8 on the upper surface (ILD-TOP) of the second interlayer insulation film 6 and the bottom 7a and side surface 7b of the groove 7.

Figure 7:
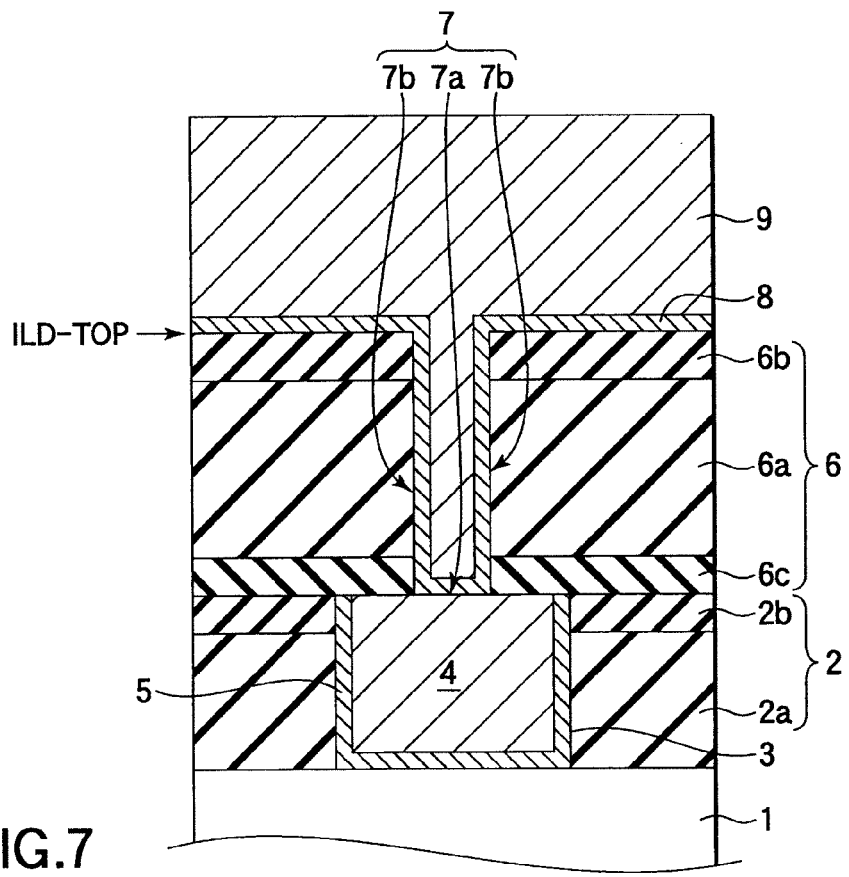
FIG. 7 is a sectional view showing a main process step of the semiconductor device manufacturing method according to an embodiment of the present invention.

Then, as shown in FIG. 7, a copper-containing conductive film, such as a copper film 9 as in this embodiment, is formed on the barrier layer 8.

As described above, in the semiconductor device manufacturing method according to this embodiment, the organic acid gas and oxidizing gas are used for etching the copper deposits 13, without using water ($H_2O$), to remove the copper deposits 13. Since no water ($H_2O$) is used to remove the copper deposits 13, a low dielectric constant insulation film is prevented from causing moisture absorption. Accordingly, even where the interlayer insulation films 2 and 6 comprise low dielectric constant insulation films, it is possible to solve a problem concerning an increase in the dielectric constant of the low dielectric constant insulation films.

In this embodiment, since an oxidizing gas is used for removing the copper deposits 13, oxidation may be developed in the copper interconnection line 4 and generate copper oxide on the upper surface 4a of the copper interconnection line 4. However, after the copper deposits 13 are removed, a reduction process is performed on the copper oxide 10 to return it to copper, and so no problem is left due to the oxidation described above. Consequently, it is possible to suppress an increase in the resistivity of the underlying metal film, i.e., the copper interconnection line 4 in this embodiment.

Further, in this embodiment, the reduction of the copper oxide 10 is performed by use of a hydrogen annealing method, ultra-low oxygen partial pressure annealing method, or carbon monoxide annealing method. In this case, since no organic acid gas is used, the copper film present in the groove 3, i.e., the copper interconnection line 4 in this embodiment, is prevented from being etched during the reduction of the copper oxide 10. Where the copper interconnection line 4 is less etched, the copper interconnection line 4 can hardly suffer an unnecessary decrease in the film thickness. Since the film thickness is prevented from causing an unnecessary decrease, it is possible to reliably suppress an increase in the resistivity of the underlying metal film, i.e., the copper interconnection line 4 in this embodiment.

Therefore, according to this embodiment, there is provided a semiconductor device manufacturing method, which can remove copper deposits without entailing an increase in the resistivity of an underlying metal film or an increase in the dielectric constant of a low dielectric constant insulation film.

Next, an explanation will be given of examples of the materials of respective members.

<Inter-Level Insulation Films 2 and 6>

In this embodiment, an interlayer insulation film, which easily causes moisture absorption, can be used, because the copper deposits 13 are removed without using water ($H_2O$). Accordingly, each of the interlayer insulation films 2 and 6 is preferably formed of a low dielectric constant insulation film (Low-k film) having a dielectric constant lower than those of inorganic silicon oxide films. The low dielectric constant insulation film means an insulation film that has a dielectric constant lower than those of inorganic silicon oxide films. For example, inorganic silicon oxide films deposited by a CVD method using TEOS as a source gas have a dielectric constant k of about 4.2. Accordingly, in this specification, the low dielectric constant insulation film is defined as an insulation film having a dielectric constant k of less than 4.2.

The low dielectric constant insulation films 2 and 6 may be formed of a material exemplified by:
1) a siloxane-family material,
2) an organic material, and
3) a porous material.

The siloxane-family material may be exemplified by:
1) a material containing Si, O, and H, such as HSQ (Hydrogen-Silsesquioxane), and
2) a material containing Si, C, O, and H, such as MSQ (Methyl-Silsesquioxane).

The organic material may be exemplified by:
1) a polyallylene ether-family material,
2) a polyallylene hydrocarbon-family material,
3) a parylene-family material,
4) a benzocyclobutene (BCB)-family material,
5) a polytetrafluoroethylene (PTFE)-family material,
6) a polyimide fluoride-family material, and
7) a CF-family material prepared by use of a fluorocarbon gas as a source.

The porous material may be exemplified by:
1) porous MSQ,
2) porous polyallylene hydrocarbon, and
3) porous silica.

<Hard Mask Layers 2b and 6b>

The hard mask layers 2b and 6b may be formed of a material exemplified by:
1) polybenzooxazole,
2) SiOC, and
3) SiC.

<Etching Stopper Layer 6c>

The etching stopper layer 6c may be formed of the same material as the hard mask layers 2b and 6b.

<Barrier Layer 8>

The barrier layer 8 is a conductive layer, which may be formed of a Ti-containing metal, such as Ti or TiN, a multi-layered film of Ti and a Ti-containing metal, a Ta-containing metal, such as Ta or TaN, and a multi-layered film of Ta and a Ta-containing metal.

<Semiconductor Substrate Processing System>

Next, an explanation will be given of a semiconductor substrate processing system used for a semiconductor device manufacturing method according to an embodiment.

Figure 9:
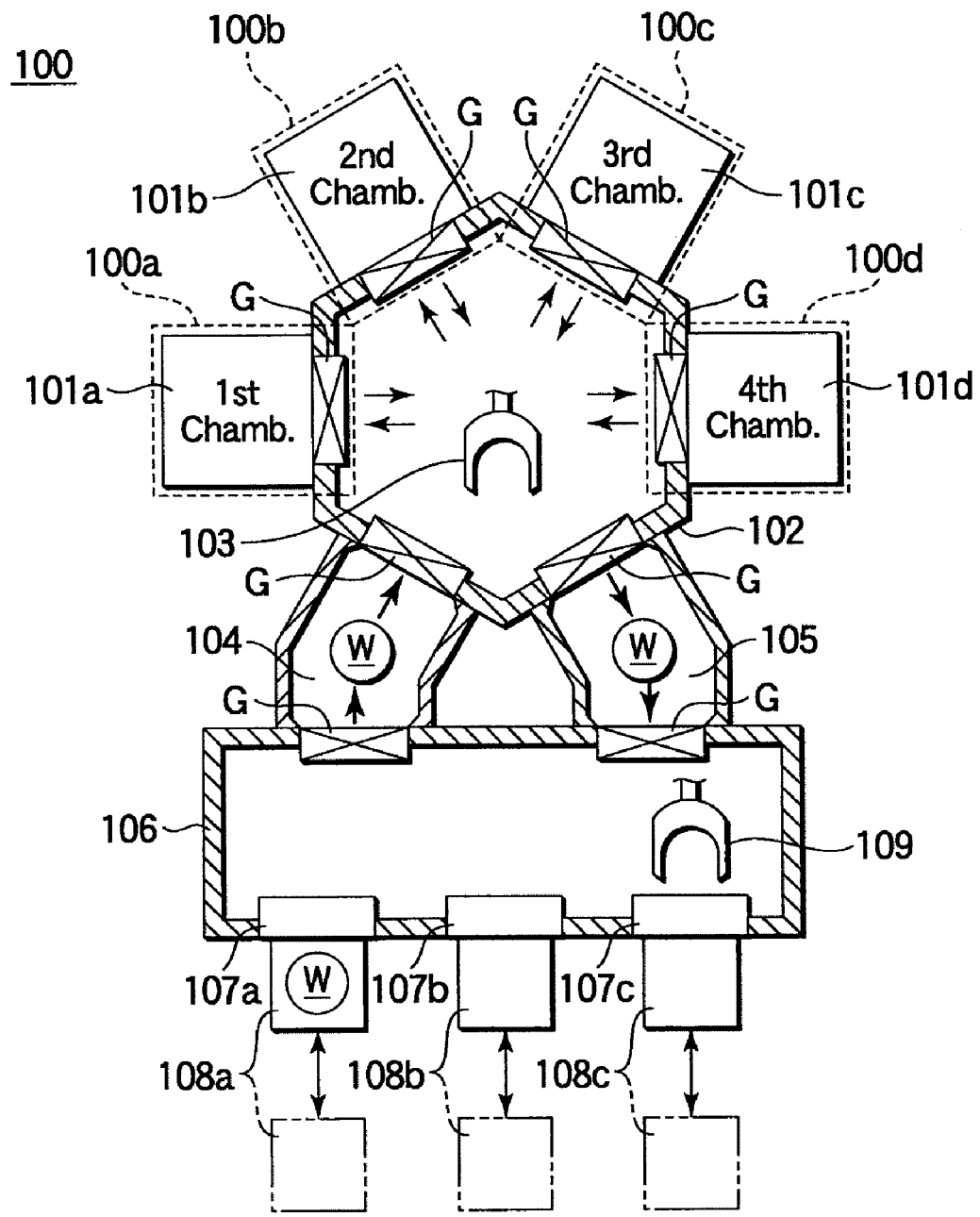
FIG. 9 is a sectional plan view showing a semiconductor substrate processing system used for a manufacturing method according to an embodiment.

In this embodiment, removal of the copper deposits 13, reduction of the copper oxide 10, formation of the barrier layer 8, and formation of the copper-containing conductive film 9 may be performed inside the same chamber or respective chambers. FIG. 9 shows a semiconductor substrate processing system used for performing the processes described above inside respective chambers.

As shown in FIG. 9, the processing system 100 according to this embodiment is formed of a processing system of the multi-chamber type and includes a first chamber (1st Chamb.) 101a, a second chamber (2nd Chamb.) 101b, a third chamber (3rd Chamb.) 101c, and a fourth chamber (4th Chamb.) 101d, as well as a transfer chamber 102 connecting these four chambers 101a to 101d to each other.

Each of the transfer chamber 102 and chambers 101a to 101d is configured to set the interior at a predetermined pressure, such as $10^{-5}$ Pa or more and 1,333 Pa or less, i.e., a decreased pressure (a pressure within this range is called a vacuum pressure in this specification), and to set the interior to maintain a predetermined atmosphere. Further, the transfer chamber 102 is provided with a transfer unit 103 disposed therein for transferring semiconductor substrates (semiconductor wafers) W. While a vacuum pressure is maintained inside the transfer chamber 102, semiconductor substrates W are transferred (vacuum transfer) by the transfer unit 103 among the first chamber 101a to fourth chamber 101d.

The processing system 100 will be explained below in more detail.

As shown in FIG. 9, the first chamber 101a belongs to a first processing unit 100a for etching the copper deposits 13. The second chamber 101b belongs to a second processing unit 100b for reducing the copper oxide 10. The third chamber 101c belongs to a third processing unit 100c for forming the barrier layer 8. The fourth chamber 101d belongs to a fourth processing unit 100d for forming a copper-containing conductive film, such as the copper film 9 as in this embodiment. These four processing units 100a to 100d are respectively connected to four sides of the hexagonal transfer chamber 102. The other two sides of the transfer chamber 102 are respectively connected to load-lock chambers 104 and 105. An I/O (in/out) chamber 106 is connected to the load-lock chambers 104 and 105 on the side opposite to the transfer chamber 102. A plurality of, such as three as in this embodiment, ports 107a to 107c are connected to the I/O chamber 106 on the side opposite to the load-lock chambers 104 and 105. The ports 107a to 107c are configured to respectively attach carriers 108a to 108c each of which can store a plurality of semiconductor substrates W.

The chambers 101a to 101d and load-lock chambers 104 and 105 are connected to the respective sides of the transfer chamber 102 respectively through gate valves G.

Similarly, the load-lock chambers 104 and 105 are connected to the I/O chamber 106 respectively through gate valves G.

The ports 107a to 107c are configured to respectively attach carriers 108a to 108c, which store semiconductor substrates W or are empty. The ports 107a to 107c are respectively provided with shutters (not shown).

The I/O chamber 106 is provided with a transfer unit 109 disposed therein for transferring semiconductor substrates W to and from the carriers 108a to 108c and for transferring semiconductor substrates W to and from the load-lock chambers 104 and 105.

Figure 10:
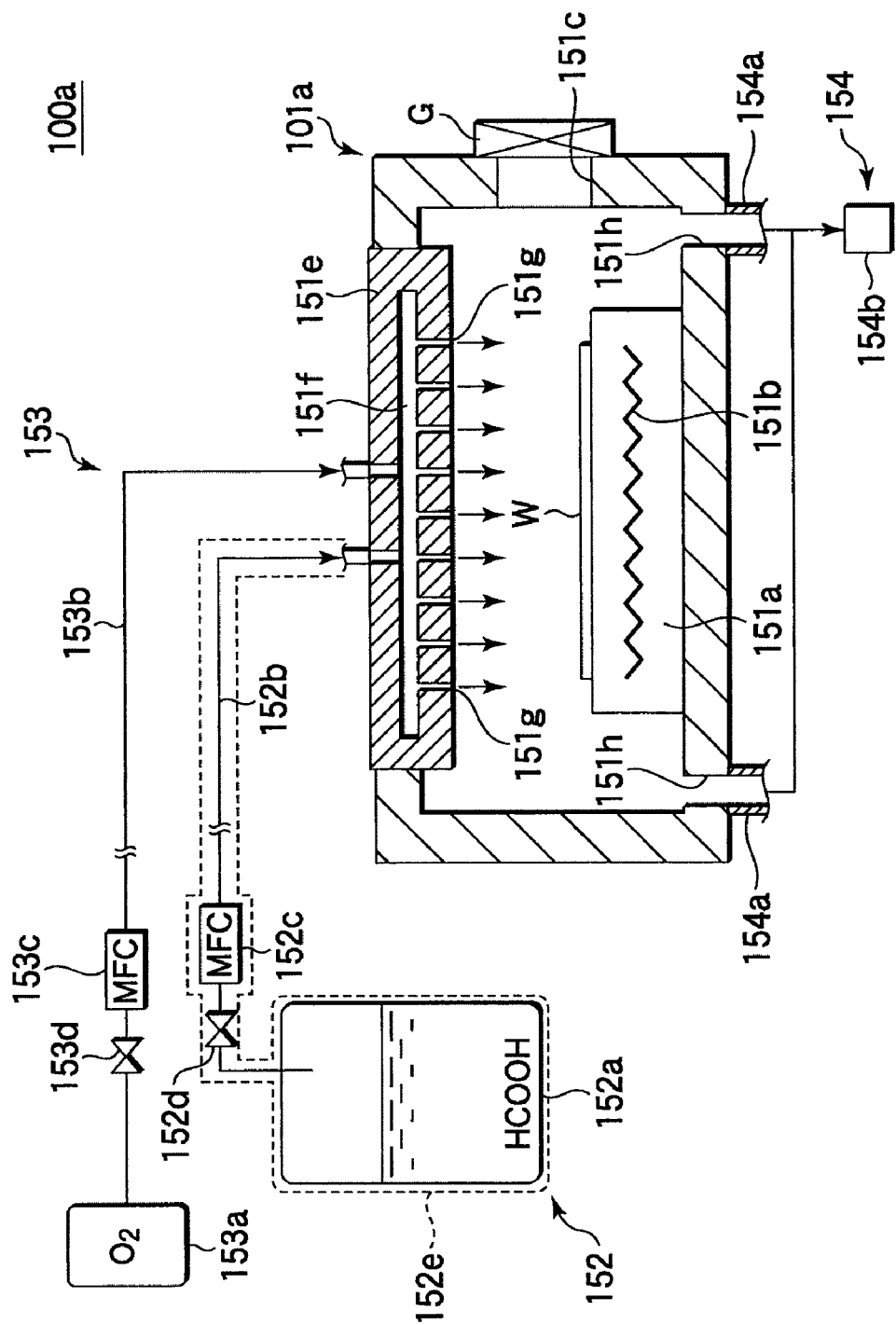
FIG. 10 is a sectional view showing a processing unit used in the processing system shown in FIG. 9.

The chamber 101a is used for etching the copper deposits 13. FIG. 10 shows a processing apparatus usable as the first processing unit 100a.

This example of the processing unit (semiconductor substrate processing apparatus) 100a is configured to use formic acid (HCOOH) as the organic acid gas and to use oxygen ($O_2$) as the oxidizing gas, so as to etch the copper deposits 13.

As shown in FIG. 10, the processing unit 100a includes a chamber 101a configured to accommodate a semiconductor substrate W. An organic acid gas supply mechanism 152 is connected to the chamber 101a to supply the organic acid gas, i.e., formic acid in this embodiment, into the chamber 101a. Further, an oxidizing gas supply mechanism 153 is connected to the chamber 101a to supply the oxidizing gas, i.e., oxygen in this embodiment, into the chamber 101a. A pressure-decreasing mechanism 154 is disposed to decrease the pressure inside the chamber 101a to a predetermined pressure, such as a vacuum pressure. Further, although not shown in FIG. 10, a dilution gas/inactive gas supply mechanism may be connected to the chamber 101a to supply a dilution gas for diluting the organic acid gas or an inactive gas. Each of the dilution gas and inactive gas is exemplified by nitrogen ($N_2$).

The chamber 101a has an essentially cylindrical or box-like shape and is opened at the top. The chamber 101a is provided with a susceptor 151a disposed on the bottom to place a loaded semiconductor substrate W thereon. The susceptor 151a has a heating mechanism or heater 151b embedded therein for heating the semiconductor substrate W. The chamber 101a has a transfer port 151c formed in the sidewall for transferring the semiconductor substrate W therethrough, and the transfer port 151c is provided with a gate valve G for opening/closing it.

The top opening of the chamber 101a is closed by a showerhead 151e set to face the susceptor 151a. The showerhead 151e has a diffusion space 151f formed therein to diffuse the organic acid gas from the organic acid gas supply mechanism 152 and a dilution gas (not shown). The showerhead 151e further has a plurality of or a number of delivery holes 151g formed in the counter surface facing the susceptor 151a, for delivering the organic acid gas from the organic acid gas supply mechanism 152 and a dilution gas (not shown) into the chamber 101a.

Exhaust ports 151h are formed at the bottom of the chamber 101a. The pressure-decreasing mechanism 154 includes exhaust lines 154a connected to the exhaust ports 151h and an exhaust unit 154b for forcibly exhausting gas from inside the chamber 101a through the exhaust lines 154a.

The organic acid gas supply mechanism 152 includes an organic acid gas source reservoir 152a for storing an organic acid used as a gas source for the organic acid gas, i.e., formic acid in this embodiment. A supply line 152b is connected to the organic acid gas source reservoir 152a to supply the vaporized organic acid gas therefrom into the diffusion space 151f of the showerhead 151e. The supply line 152b is provided with a mass-flow controller 152c and a valve 152d, wherein the mass-flow controller 152c is used as a flow rate adjusting mechanism for adjusting the flow rate of the organic acid gas flowing therethrough. For example, the organic acid gas supply mechanism 152 includes a heater 152e for heating the organic acid gas to a predetermined temperature, so as to vaporize it.

The oxidizing gas supply mechanism 153 includes an oxidizing gas supply source 153a and a supply line 153b connected to the oxidizing gas supply source 153a to supply the oxidizing gas therefrom into the diffusion space 151f of the showerhead 151e. The supply line 153b is provided with a mass-flow controller 153c and a valve 153d, wherein the mass-flow controller 153c is used as a flow rate adjusting mechanism for adjusting the flow rate of the oxidizing gas flowing therethrough.

In the processing unit 100a structured as described above, the pressure inside the chamber 101a is decreased by the pressure-decreasing mechanism 154 to a predetermined pressure, such as a vacuum pressure. Further, the oxidizing gas is supplied from the oxidizing gas supply mechanism 153 into the chamber 101a to maintain a predetermined oxidizing gas atmosphere inside the chamber 101a. Then, while the interior of the chamber 101a is set to have a predetermined pressure and a predetermined oxidizing gas atmosphere, the semiconductor substrate W is heated by the heater 151b to a predetermined temperature. Consequently, the copper deposits 13 present on the semiconductor substrate W are oxidized.

After the oxidation, the oxidizing gas is exhausted from inside the chamber 101a. After the exhaust operation, a dilution gas is supplied from the dilution gas/inactive gas supply mechanism (not shown) into the chamber 101a. Further, the organic acid gas is supplied from the organic acid gas supply mechanism 152 into the chamber 101a to maintain a predetermined organic acid gas and dilution gas atmosphere inside the chamber 101a. Then, while interior of the chamber 101a is set to have a predetermined organic acid gas and dilution gas atmosphere, the semiconductor substrate W is heated by the heater 151b to a predetermined temperature. Consequently, the oxidized copper deposits 13 present on the semiconductor substrate W are etched.

The processing unit 100a is used as described above, so that the copper deposits 13 are etched.

Figure 11:
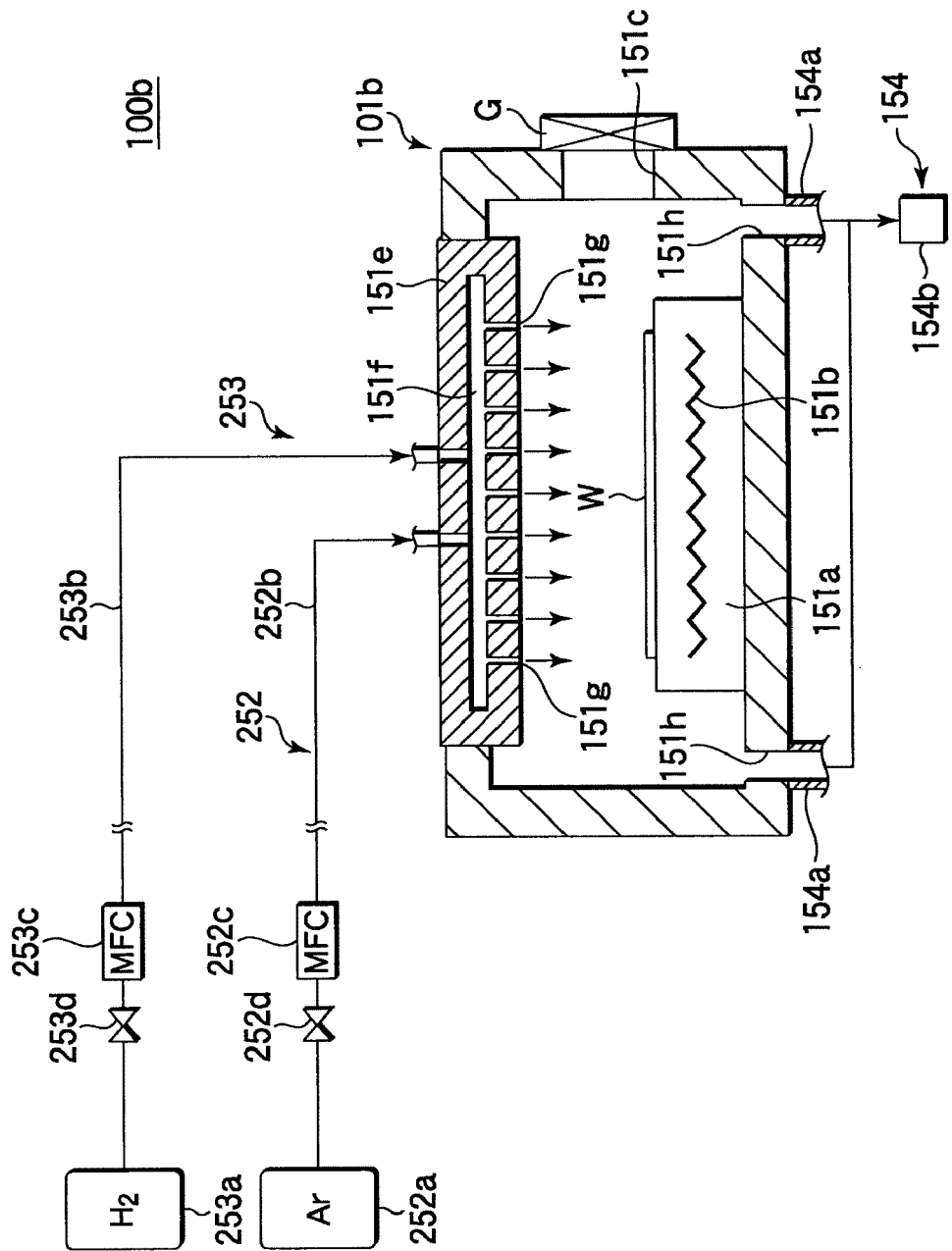
FIG. 11 is a sectional view showing a processing unit used in the processing system shown in FIG. 9.

After the etching, the second chamber 101b is used to reduce the copper oxide 10 in accordance with one of the methods explained in the embodiment. FIG. 11 shows a processing apparatus usable as the second processing unit 100b.

This example of the processing unit 100b is configured to perform a reduction process in accordance with a hydrogen annealing method.

As shown in FIG. 11, the processing unit 100b is arranged essentially as a heat processing apparatus, and, for example, it has a structure similar to the processing unit 100a shown in FIG. 10. The processing unit 100b particularly differs from the processing unit 100a shown in FIG. 10 in that the chamber 101b for accommodating a semiconductor substrate W is connected to an inactive gas supply mechanism 252 for supplying an inactive gas into the chamber 101b and a hydrogen gas supply mechanism 253 for supplying hydrogen gas into the chamber 101b. Otherwise, the processing unit 100b has the same structure as the processing unit 100a described above.

For example, the reduction process is performed by the processing unit 100b, as follows.

At first, the valves 252d and 253d are opened to supply the inactive gas and hydrogen gas from the inactive gas supply source 252a and hydrogen gas supply source 253a through the mass-flow controllers 252c and 253c. The mass-flow controller 252c adjusts the flow rate of the inactive gas. The inactive gas with a flow rate thus adjusted is supplied through the supply line 252b into the diffusion space 151f of the showerhead 151e. The inactive gas is exemplified by argon (Ar) gas.

The mass-flow controller 253c adjusts the flow rate of the hydrogen gas. The hydrogen gas with a flow rate thus adjusted is supplied through the supply line 253b into the diffusion space 151f of the showerhead 151e as in the inactive gas. The pressure inside the chamber 101b is set by the pressure-decreasing mechanism 154 at a vacuum pressure of, e.g., $10^{-5}$ Pa or more and 1,333 Pa or less.

With the conditions described above, the semiconductor substrate W placed on the susceptor 151a is heated by the heater 151b to, e.g., about 300° C. This state is maintained for a predetermined time, such as several minutes, to reduce the copper oxide 10.

The processing unit 100b is used as described above, so that the copper oxide 10 is reduced.

Figure 12:
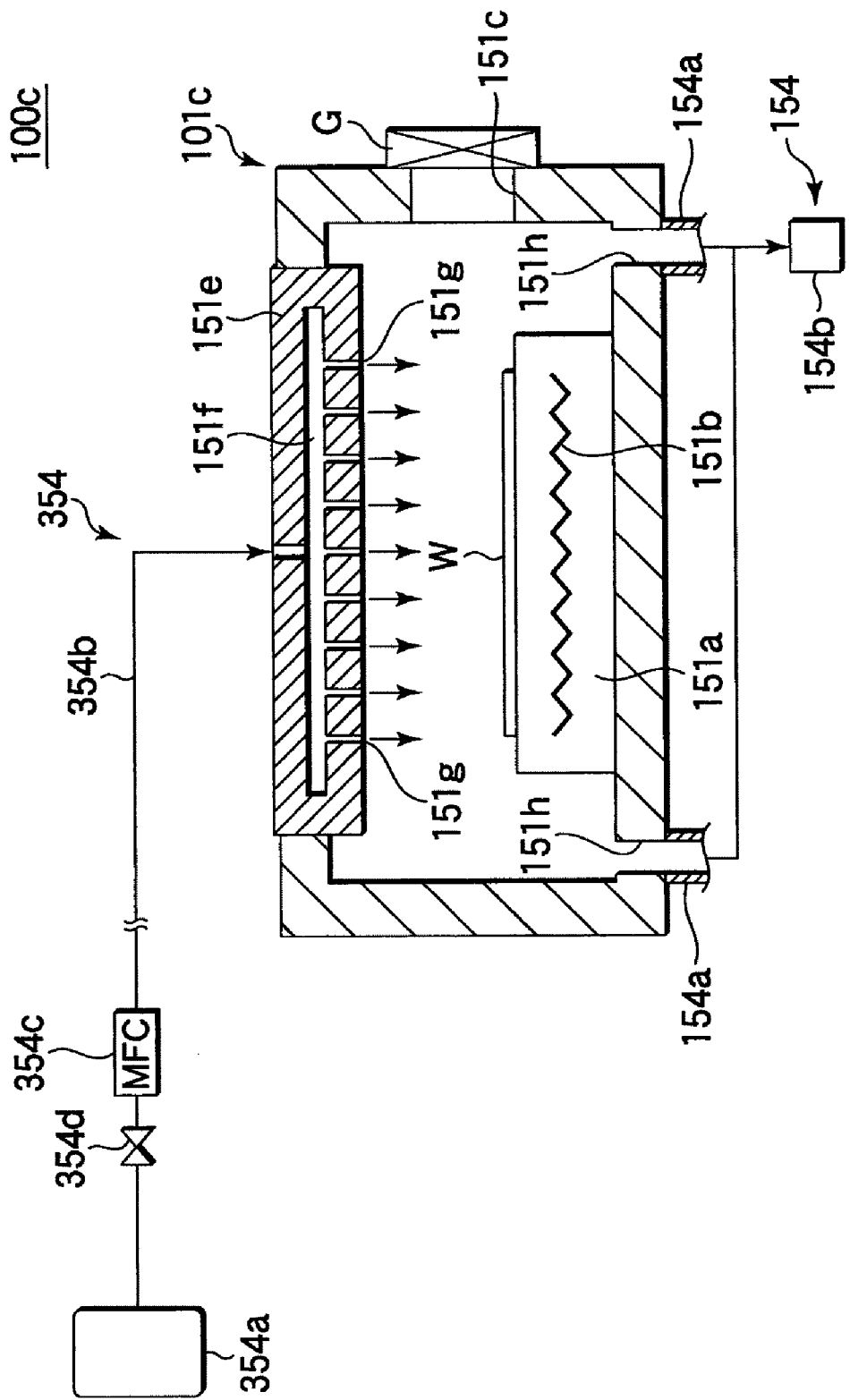
FIG. 12 is a sectional view showing a processing unit used in the processing system shown in FIG. 9.

After the reduction, the third chamber 101c is used to form the barrier layer 8 in accordance with one of the methods explained in the embodiment. FIG. 12 shows a processing apparatus usable as the third processing unit 100c.

As shown in FIG. 12, the processing unit 100c is also arranged essentially as a heat processing apparatus, and, for example, it has a structure similar to the processing unit 100a shown in FIG. 10. The processing unit 100c particularly differs from the processing unit 100a shown in FIG. 10 in that the chamber 101c is connected to a film formation gas supply mechanism 354 for supplying a film formation gas for forming the barrier layer 8 into the chamber 101c. Otherwise, the processing unit 100c has the same structure as the processing unit 100a described above.

The film formation process performed by the processing unit 100c is of a thermal CVD type, in which the film formation gas is supplied into the chamber 100c, while the semiconductor substrate W is heated by the heater 151b, so that the barrier layer 8 is deposited.

Where the barrier layer 8 is formed by use of titanium (Ti), a metal compound used as a film formation gas source may be exemplified by:

1) titanium tetrachloride ($TiCl_4$),
2) titanium tetrafluoride ($TiF_4$),
3) titanium tetrabromide ($TiBr_4$),
4) titanium tetraiodide ($TiI_4$),
5) tetrakisethylmethylamino titanium ($Ti[N(C_2H_5CH_3)]_4$ (TEMAT)),
6) tetrakisdimethylamino titanium ($Ti[N(CH_3)_2]_4$ (TDMAT)), and
7) tetrakisdiethylamino titanium ($Ti[N(C_2H_5)_2]_4$ (TDEAT)).

Where the barrier layer 8 is formed by use of tantalum (Ta), a metal compound uses as a film formation gas source may be exemplified by:

1) tantalum pentachloride ($TaCl_5$),
2) tantalum pentafluoride ($TaF_5$),
3) tantalum pentabromide ($TaBr_5$),
4) tantalum pentaiodide ($TaI_5$),
5) tertiarybutylimidotris(diethylamido) tantalum ($Ta(NC(CH_3)_3)(N(C_2H_5)_2)_3$ (TBTDET)), and
6) tertiaryamylimidotris(dimethylamido) tantalum ($Ta(NC(CH_3)_2C_2H_5)(N(CH_3)_2)_3$).

Where a reduction process is performed on the metal compound described above, the reducing organic substance may be exemplified by:

1) an alcohol having a hydroxyl group (—OH),
2) an aldehyde having an aldehyde group (—CHO),
3) a carboxylic acid including a carboxyl group (—COOH),
4) an carboxylic anhydride,
5) an ester,
6) an organic acid ammonium salt,
7) an organic acid amine salt,
8) an organic acid amido,
9) an organic acid hydrazide,
10) an organic acid metal complex, and
11) an organic acid metal salt, wherein at least one of these materials may be used. Further, hydrogen or ammonia may be used.

A metal film formation method using a metal compound and a reducing organic substance as described above is disclosed in a patent application (Japanese patent application No. 2006-208726) accompanied by ownership common to this application.

Further, in place of the deposition method described above, the formation of the barrier layer 8 may be performed by use of a sputtering method.

Figure 13:
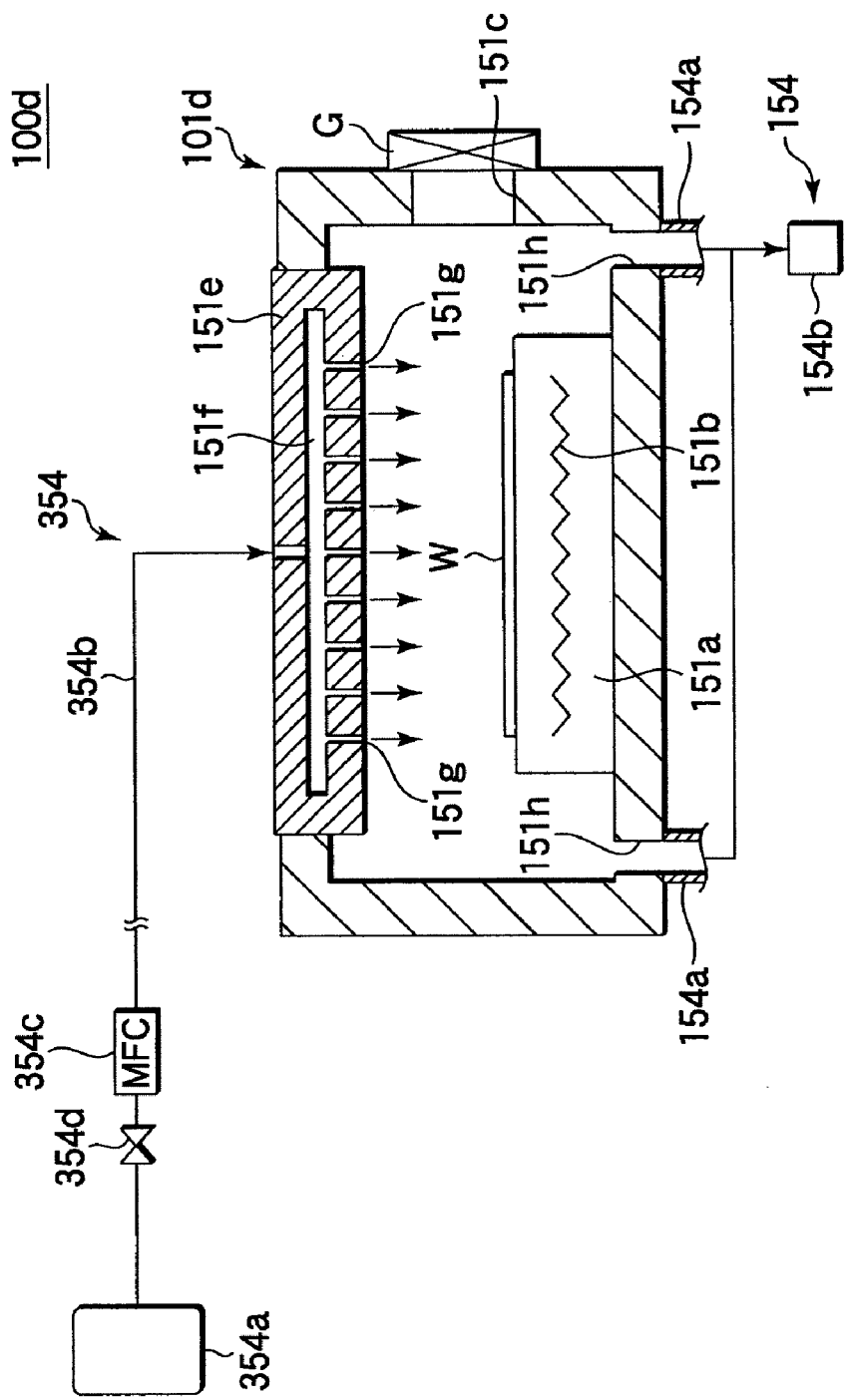
FIG. 13 is a sectional view showing a processing unit used in the processing system shown in FIG. 9.

After the barrier layer 8 is formed, the fourth chamber 101d is used to form a copper-containing conductive film, such as the copper film 9 as in this embodiment, in accordance with one of the methods explained in the embodiment. FIG. 13 shows a processing apparatus usable as the fourth processing unit 100d.

As shown in FIG. 13, the processing unit 100d can be the same unit as the processing unit 100c shown in FIG. 12, only if a metal compound uses as a film formation gas source is changed, for example. Where the copper film 9 is formed, a metal compound uses as a film formation gas source may be changed to one of those exemplified by:

1) copper hexafluoroacetylacetonate ($Cu(hfac)_2$),
2) copper acetylacetonate ($Cu(acac)_2$),
3) copper dipivaloylmethanate ($Cu(dpm)_2$),
4) copper diisobutyrylmethanate ($Cu(dibm)_2$),
5) copper isobutyrylpivaloylmethanate ($Cu(ibpm)_2$),
6) copper bis 6-ethyl-2,2-dimethyl-3,5-decanedionato ($Cu(edmdd)_2$),
7) copper hexafluoroacetylacetonatetrimethylvinyl silane (Cu(hfac)TMVS), and
8) copper hexafluoroacetylacetonate 1,5-cyclooctadiene (Cu(hfac)COD).

Where a reduction process is performed on the metal compound described above, the reducing organic substance may be exemplified by the same reducing organic substances used for the processing unit 100c.

In place of the deposition method described above, the formation of the copper film 9 may be performed by use of a sputtering method, electroless plating method, or electrolytic plating method. Further, a copper alloy film formed of an alloy of copper with another metal material may be used.

According to this processing system 100, a semiconductor substrate W is transferred among the chambers 101a to 101d while a vacuum pressure is maintained. Accordingly, this processing system 100 is advantageous such that, for example, after the reduction of the copper oxide 10, the barrier layer 8 is formed under a state where a copper oxide can be hardly regenerated on the reduced upper surface 4a of the copper interconnection line 4.

Further, this processing system 100 is advantageous such that, after the formation of the barrier layer 8, the copper film 9 is formed under a state where the barrier layer 8 can be hardly oxidized.

Next, an explanation will be given of an alternative semiconductor substrate processing system used for a semiconductor device manufacturing method according to an embodiment.

Figure 14:
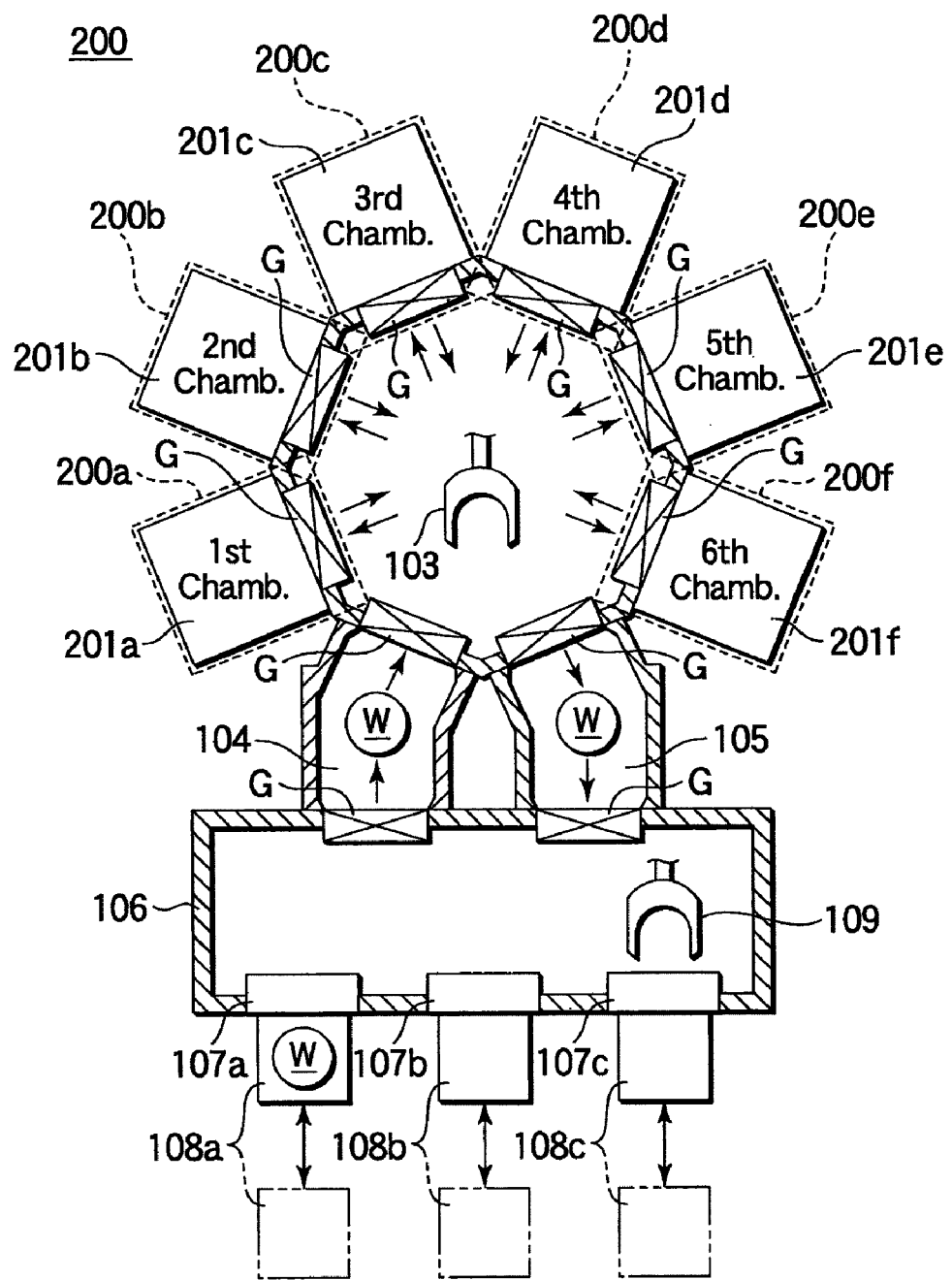
FIG. 14 is a sectional plan view showing an alternative semiconductor substrate processing system used for a manufacturing method according to an embodiment.

FIG. 14 is a sectional plan view showing an alternative semiconductor substrate processing system used for a manufacturing method according to an embodiment.

The alternative processing system 200 shown in FIG. 14 is structured such that the processing system 100 shown in FIG. 9 is further provided with a chamber for etching the interlayer insulation film 6 shown in FIG. 1 and a chamber for ashing the resist film 12 shown in FIG. 1, wherein a semiconductor substrate W is transferred among the chambers while a vacuum pressure is maintained.

As shown in FIG. 14, the alternative processing system 200 includes six chambers 201a to 201f connected to one transfer chamber 102.

Each of the transfer chamber 102 and chambers 201a to 201f is configured to set the interior at a predetermined pressure, such as a vacuum pressure, and to set the interior to maintain a predetermined atmosphere. Further, the transfer chamber 102 is provided with a transfer unit 103 disposed therein for transferring semiconductor substrates (semiconductor wafers) W. While a vacuum pressure is maintained inside the transfer chamber 102, semiconductor substrates W are transferred by the transfer unit 103 among the first chamber 201a to sixth chamber 201f.

As shown in FIG. 14, the first chamber 201a belongs to a first processing unit 200a for forming the groove 7 in the interlayer insulation film 6. The second chamber 201b belongs to a second processing unit 200b for ashing the photo-resist film 12. The other processing units 200c to 200f are the same as the processing units 100a to 100d of the processing system 100 shown in FIG. 9. These six processing units 200a to 200f are respectively connected to six sides of the octagonal transfer chamber 102. The other two sides of the transfer chamber 102 are respectively connected to load-lock chambers 104 and 105. The other portions of the processing system 200 are the same as those of the processing system 100 shown in FIG. 9.

As in the processing system 200, formation of the groove 7 and ashing of the photo-resist film 12 may be performed along with removal of the copper deposits 13, reduction of the copper oxide 10, formation of the barrier layer 8, and formation of the copper-containing conductive film 9 inside the same processing system.

The processing system 200 is advantageous such that, where the interlayer insulation film 6 comprises a low dielectric constant insulation film 6b, the low dielectric constant film 6b is prevented from causing moisture absorption. When the groove 7 is formed in the low dielectric constant insulation film 6b, the low dielectric constant insulation film 6b is exposed at the side surface 7b of the groove 7. If the wafer with the low dielectric constant insulation film 6b exposed thereon is transferred out of the processing system, the low dielectric constant insulation film 6b may absorb moisture from, e.g., air, and increase the dielectric constant.

In this respect, according to the processing system 200, formation of the groove 7 and ashing of the photo-resist film 12 are performed along with the other processes from removal of the copper deposits 13 inside the same processing system. In this case, even if the low dielectric constant insulation film 6 is exposed at the side surface 7b of the groove 7, the low dielectric constant insulation film 6 can hardly cause moisture absorption. Consequently, the low dielectric constant insulation film 6b is advantageously prevented from increasing the dielectric constant, as compared to a case where formation of the groove 7 and ashing of the photo-resist film 12 are performed in a processing system separate from a processing system for performing the other processes from removal of the copper deposits 13.

According to the embodiments of the present invention described above, there is provided a semiconductor device manufacturing method, which can remove copper deposits without entailing an increase in the resistivity of an underlying metal film or an increase in the dielectric constant of a low dielectric constant insulation film due to moisture absorption. Further, there is provided a target substrate processing system used for this manufacturing method and a storage medium for controlling the processing system.

The present invention has been described with reference to embodiments, but the present invention is not limited to the embodiments described above, and it may be modified in various manners within the scope of the claims. In place of the embodiments described above, the present invention may be realized in other embodiments.

For example, in the embodiments described above, a semiconductor device manufacturing method according to the present invention is applied to a case where a copper-containing conductive film is embedded in the groove 7 reaching the copper interconnection line 4. However, in place of embedding in the groove 7 reaching the copper interconnection line 4, the present invention may be applied to a process for embedding in a groove reaching a copper via-member used as an internal electric connector member, or other various processes for embedding in groove patters formed in semiconductor devices, such as groove patterns (gate electrode patterns) reaching word lines in semiconductor memory devices.

Figure 15:
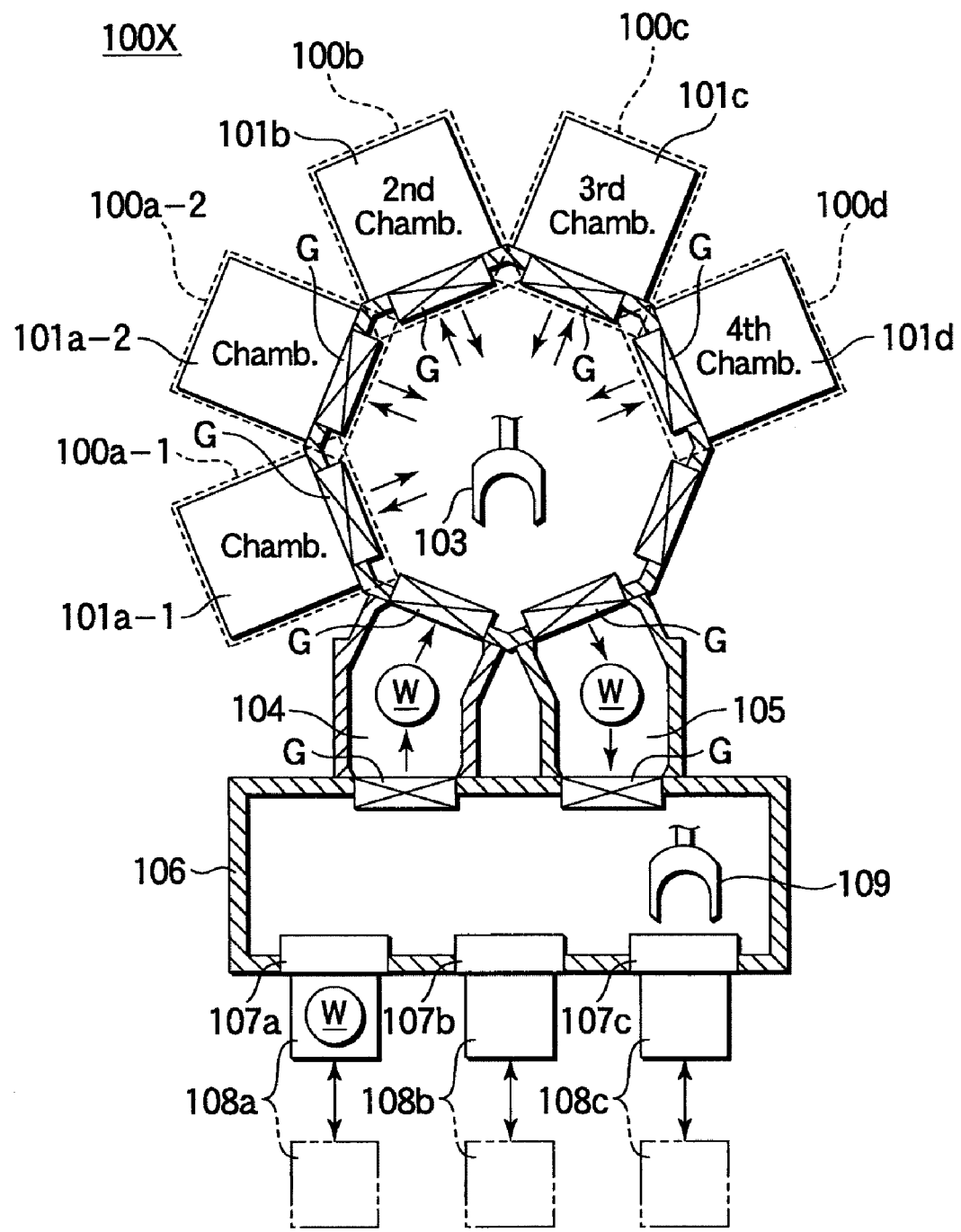
FIG. 15 is a sectional plan view showing another alternative semiconductor substrate processing system used for a manufacturing method according to an embodiment.

Further, in the embodiments described above, when the copper deposits 13 is etched, oxidation of the copper deposits 13 and etching of the oxidized copper deposits 13 by an organic acid gas are performed in the same chamber, but these oxidation and etching may be performed in respective chambers. For example, in the processing system 100 shown in FIG. 9, the processing unit 100a is structured to perform oxidation of the copper deposits 13 and etching of the oxidized copper deposits 13. Where the functions of this processing unit 100a are separated, a processing system 100X is adopted, as shown in FIG. 15. Specifically, in this processing system 100X, a processing unit 100a-1 including a chamber 101a-1 is structured to perform oxidation of the copper deposits 13, and a processing unit 100a-2 including a chamber 101a-2 is structured to perform etching of the oxidized copper deposits 13. The other processing units 100b, 100c, and 100d are structured to have the same functions as those of the units shown in FIG. 9.

In the embodiments described above, each of the barrier layers 5 and 8 is formed on the side surface and bottom of a groove. However, each of the barrier layers 5 and 8 needs to be formed at least on an interlayer insulation film with a groove formed therein, such that it is formed only on the side surface of a groove, for example.

The processing system may be provided with a control mechanism comprising a process controller and a storage section including a storage medium, wherein the storage medium stores computer readable programs or recipes for executing semiconductor device manufacturing methods according to the embodiments described above. The process controller retrieves a recipe and controls the processing system in accordance with the retrieved recipe. The storage medium may be formed of a medium of the stationary type, such as a hard disk or semiconductor memory, or a medium of the portable type, such as a CD-ROM, DVD, or flash memory. Alternatively, the recipes may be used online while they are transmitted from another apparatus through, e.g., a dedicated line, as needed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A target substrate processing system for processing a target substrate that includes a first interlayer insulation film provided with a copper-containing electric connector member and a second interlayer insulation film disposed on the first interlayer insulation film and having a groove formed therein and reaching the electric connector member, the system comprising:
   a removing implement configured to remove copper deposits from the target substrate by use of an organic acid gas and an oxidizing gas,
   a reducing implement configured to reduce the electric connector member;
   a barrier layer forming implement configured to form a barrier layer on the target substrate; and
   a conductive film forming implement configured to form a copper-containing conductive film on the target substrate.

2. The target substrate processing system according to claim 1, wherein the system comprises a chamber or chambers provided with the removing implement, the reducing implement, the barrier layer forming implement, and the conductive film forming implement.

3. The target substrate processing system according to claim 1, wherein the system comprises a plurality of chambers respectively provided with the removing implement, the reducing implement, the barrier layer forming implement, and the conductive film forming implement, and a transfer mechanism configured to transfer the target substrate among the chambers.

4. The target substrate processing system according to claim 1, wherein the removing implement comprises:
   an oxidizing implement configured to oxidize the copper deposits by use of the oxidizing gas; and
   an etching implement configured to etch the oxidized copper deposits by use of the organic acid gas.

5. The target substrate processing system according to claim 4, wherein the system comprises a plurality of chambers respectively provided with the oxidizing implement, the etching implement, the reducing implement, the barrier layer forming implement, and the conductive film forming implement, and a transfer mechanism configured to transfer the target substrate among the chambers.

6. A target substrate processing system for processing a target substrate that includes a first interlayer insulation film provided with a copper-containing electric connector member and a second interlayer insulation film disposed on the first interlayer insulation film, along with a mask film disposed on the second interlayer insulation film, the system comprising:
   a main etching implement configured to etch the second interlayer insulation film by use of the mask film as an etching mask, thereby forming therein a groove reaching the electric connector member;
   a first removing implement configured to remove the mask film;
   a second removing implement configured to remove copper deposits from the target substrate by use of an organic acid gas and an oxidizing gas,
   a reducing implement configured to reduce the electric connector member;
   a barrier layer forming implement configured to form a barrier layer on the target substrate; and
   a conductive film forming implement configured to form a copper-containing conductive film on the target substrate.

7. The target substrate processing system according to claim 6, wherein the system comprises a chamber or chambers provided with the main etching implement, the first removing implement, the second removing implement, the reducing implement, the barrier layer forming implement, and the conductive film forming implement.

8. The target substrate processing system according to claim 6, wherein the system comprises a plurality of chambers respectively provided with the main etching implement, the first removing implement, the second removing implement, the reducing implement, the barrier layer forming implement, and the conductive film forming implement, and a transfer mechanism configured to transfer the target substrate among the chambers.

9. The target substrate processing system according to claim 6, wherein the second removing implement comprises:
   an oxidizing implement configured to oxidize the copper deposits by use of the oxidizing gas; and
   a sub-etching implement configured to etch the oxidized copper deposits by use of the organic acid gas.

10. The target substrate processing system according to claim 9, wherein the system comprises a plurality of chambers respectively provided with the main etching implement, the first removing implement, the oxidizing implement, the sub-etching implement, the reducing implement, the barrier layer forming implement, and the conductive film forming implement, and a transfer mechanism configured to transfer the target substrate among the chambers.

* * * * *